United States Patent
Koscielnik et al.

(10) Patent No.: US 9,634,684 B2
(45) Date of Patent: Apr. 25, 2017

(54) METHOD AND APPARATUS FOR ENCODING ANALOG SIGNAL INTO TIME INTERVALS

(71) Applicant: Akademia Gorniczo-Hutnicza im. Stanislawa Staszica, Cracow (PL)

(72) Inventors: Dariusz Koscielnik, Cracow (PL); Marek Miskowicz, Cracow (PL)

(73) Assignee: Akademia Gorniczo-Hutnicza im. Stanislawa Staszica, Cracow (PL)

( * ) Notice: Subject to any disclaimer, the term of this patent is extended or adjusted under 35 U.S.C. 154(b) by 0 days.

(21) Appl. No.: 14/972,468

(22) Filed: Dec. 17, 2015

(65) Prior Publication Data

US 2016/0344402 A1 Nov. 24, 2016

(51) Int. Cl.
| | |
|---|---|
| H03M 1/12 | (2006.01) |
| H03M 1/50 | (2006.01) |
| G06N 3/04 | (2006.01) |
| H03M 3/00 | (2006.01) |

(52) U.S. Cl.
CPC .......... *H03M 1/1245* (2013.01); *G06N 3/049* (2013.01); *H03M 1/504* (2013.01); *H03M 3/496* (2013.01); *H03M 3/30* (2013.01)

(58) Field of Classification Search
CPC .... H03M 1/1245; H03M 3/496; H03M 1/504; H03M 3/30; G06N 3/049

USPC ......................................... 341/122, 155, 143
See application file for complete search history.

(56) References Cited

U.S. PATENT DOCUMENTS

| | | | | |
|---|---|---|---|---|
| 5,221,896 | A * | 6/1993 | Kobayashi ............. | B23Q 15/24 324/207.13 |
| 7,893,861 | B2 * | 2/2011 | Bulzacchelli ........... | H03M 1/20 341/155 |
| 8,970,421 | B1 * | 3/2015 | Gao ...................... | G04F 10/005 341/166 |
| 9,124,280 | B2 * | 9/2015 | Kim ...................... | G04F 10/005 |
| 9,285,778 | B1 * | 3/2016 | Evans ................... | G04F 10/005 |

* cited by examiner

*Primary Examiner* — Brian Young
(74) *Attorney, Agent, or Firm* — Ladas & Parry LLP

(57) ABSTRACT

Method for encoding analog signal into time intervals wherein a generation of time intervals using a time encoding machine. A signal of a constant value is held during a generated time interval on a time encoding machine input by the use of a sample-and-hold circuit, while the constant value of the signal held during the generated time interval represents an instantaneous value of the analog signal at the end of a generation of a previous time interval. Apparatus for encoding analog signal into time intervals comprising a time encoding machine, and a sample-and-hold circuit. The signal is provided to an input of the sample-and-hold circuit, whose output is connected to an output of the time encoding machine. The output of the time encoding machine is connected to an output of the apparatus, and to a control input of the sample-and-hold circuit.

7 Claims, 2 Drawing Sheets

METHOD AND APPARATUS FOR ENCODING ANALOG SIGNAL INTO TIME INTERVALS

The subject of this invention is a method and an apparatus for encoding analog signal into time intervals that can be applied in processing of signals, especially bandlimited, if recovery of analog signal is required, as well as in monitoring and control systems.

A method for encoding analog signal into time intervals known from the article Aurel A. Lazar and Laszlo T. Toth, "Perfect Recovery and Sensitivity Analysis of Time Encoded Bandlimited Signals", IEEE Transactions on Circuits and Systems, vol. 51, no. 10, October 2004, pp. 2060-2073, consists in using the asynchronous Sigma-Delta modulator as the time encoding machine (TEM). The difference between an analog input signal and a binary signal produced by the output of the time encoding machine is provided to the input of an integrator. The signal on the integrator output grows when the binary signal on the time encoding machine output is positive, and respectively falls when the binary signal is negative. The signal on the integrator output is provided to the input of a Schmitt trigger, therefore, the rate of changes of the signal on the integrator output is modulated by analog input signal magnitude. The widths of positive and negative pulses on the output of the asynchronous Sigma-Delta modulator, which is at the same time the output of the Schmitt trigger, depends on the actual magnitude of the analog input signal averaged within time intervals defined by the pulse widths.

A method for encoding analog signal into time intervals known from the article J. G. Harris, Xu Jie, M. Rastogi, A. S. Alvarado, V. Garg, J. C. Principe, K. Vuppamandla, "Real Time Signal Reconstruction from Spikes on a Digital Signal Processor", IEEE International Symposium on Circuits and Systems, May 2008, pp. 1060-1063, consists in using the Spiking Neuron circuit as the time encoding machine (TEM). The input analog signal controls the intensity of the current source, which is always greater than zero. The charge delivered by the current source is successively accumulated in a capacitor, which cause an increase of a voltage on that capacitor. This voltage is compared to a prespecified threshold by the use of a comparator. When the voltage increasing on the capacitor reaches the threshold, a short pulse is produced on the output of the comparator, which is at the same time the output of the Spiking Neuron circuit that acts as the time encoding machine. This pulse turns on a transistor that connects plates of the capacitor causing capacitor discharge. When the pulse generation is terminated by the comparator, accumulation of a next charge portion is started, and the cycle is repeated. Time intervals between successive pulses generated on the output of the Spiking Neuron circuit represent magnitude of analog signal averaged within time intervals defined by the pulse widths.

An apparatus for encoding analog signal into time intervals known from the article Aurel A. Lazar and Laszlo T. Toth, "Perfect Recovery and Sensitivity Analysis of Time Encoded Bandlimited Signals", IEEE Transactions on Circuits and Systems, vol. 51, no. 10, October 2004, pp. 2060-2073, is based on the asynchronous Sigma-Delta modulator. Analog input signal is provided to a non-inverting input of an adder, whose inverting input is connected to an output of the asynchronous Sigma-Delta modulator that acts as the time encoding machine. The output of the adder is connected to the input of the integrator, whose output is connected to the non-inverting input of the Schmitt trigger. The output of the Schmitt trigger is at the same time the output of the asynchronous Sigma-Delta modulator.

An apparatus for encoding analog signal into time intervals known from the article J. G. Harris, Xu Jie, M. Rastogi, A. S. Alvarado, V. Garg, J. C. Principe, K. Vuppamandla, "Real Time Signal Reconstruction from Spikes on a Digital Signal Processor", IEEE International Symposium on Circuits and Systems, May 2008, str. 1060-1063, is based on the Spiking-Neuron circuit. Analog input signal is provided to a control input of a current source introduced between a supply voltage and a top plate of a capacitor. The top plate of the capacitor is at the same time connected to a non-inverting input of a comparator, and a reference voltage is connected to an inverting input of the comparator. The output of the comparator, which is at the same time the output of the Spiking-Neuron circuit that acts as the time encoding machine controls a gate of a transistor that acts as a switch. The transistor is connected to the capacitor in parallel, while a bottom plate of the capacitor is connected to ground of the circuit.

A method for encoding analog signal into time intervals, according to the invention, consists in a generation of time intervals using a time encoding machine, while widths of time intervals represent values of the analog signal.

The essence of the method is that a signal of a constant value is held during a generated time interval on a time encoding machine input by the use of a sample-and-hold circuit, while the constant value of the signal held during the generated time interval represents an instantaneous value of encoded analog signal at the end of generation of a previous time interval.

It is advantageous if the instantaneous value of the encoded analog signal is sampled and locked by the use of the sample-and-hold circuit when the time encoding machine terminates the generation of the previous time interval.

It is also advantageous if the signal having a constant value is held during a generated time interval on a time encoding machine input by the use of one of modules of the sample-and-hold circuit, and an actual value of the encoded analog signal is sampled the use of one of modules of the sample-and-hold circuit, while roles of the modules of the sample-and-hold circuit are interchanged cyclically at the end of the generation of each time interval.

An apparatus for encoding analog signal into time intervals, according to the invention, comprises the time encoding machine equipped with a signal input and a time output.

The essence of the apparatus is that the analog signal is provided to an input of the sample-and-hold circuit by the use of a signal input. An output of the sample-and-hold circuit is connected to an input of the time encoding machine. An output of the time encoding machine is connected to an output of the apparatus, and to a control input of the sample-and-hold circuit.

It is advantageous if the sample-and-hold circuit comprises at least two sample-and-hold modules.

It is advantageous if an asynchronous Sigma-Delta modulator acts as the time encoding machine.

It is advantageous if a Spiking-Neuron circuit acts as the time encoding machine.

Due to time encoding of samples of a signal instead of encoding a signal in continuous time, the width of each time interval represents an instantaneous value of a signal instead of its averages in time intervals of a variable width. Furthermore, due to time encoding of samples of a signal, a given time interval width depends on a given sample value. The latter simplifies the recovery of a signal based on knowledge of time interval widths because of reduction of computational complexity and improvement of recovery accuracy.

Encoding of samples of a signal eliminates also attenuation of high frequencies which happens in case of encoding a signal in continuous time by its integration. Therefore, if time intervals are further quantized and coded to digital words, quantization noise is uniformly distributed in the bandwidth of the encoded signal. Additionally, the quantization noise density reaches then its minimum which is dependent on the quantization step only.

The solution according to the invention is presented in the following figures.

The method for encoding analog signal into time intervals, according to the invention, consists in time encoding of samples of the analog signal. The value of a sample held on the input TEMin of the time encoding machine TEM during a generation of a time interval $T_x$ represents an instantaneous value of encoded analog signal when the time encoding machine terminates the generation of a previous time interval $T_{x-1}$.

The instantaneous value of encoded analog signal provided to the signal input In of the apparatus is sampled and locked by the use of the sample-and-hold circuit SH at the end of the generation of each time interval.

In the solution comprising two sample-and-hold modules MSH, the sample of encoded analog signal is held on the input TEMin of the time encoding machine TEM by the use of the first sample-and-hold module. At the same time, encoded signal is sampled and locked by the use of the first sample-and-hold module at the end of the generation of each time interval $T_x$. The roles of the sample-and-hold modules MSH are interchanged cyclically at the end of generation of each time interval.

Figure 1:
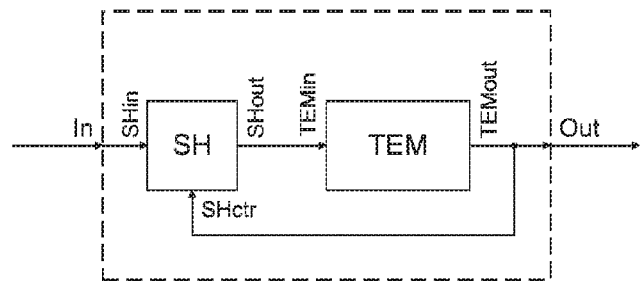
FIG. 1 illustrates the block diagram of the apparatus.

In the first embodiment, the apparatus for encoding analog signal into time intervals, according to the invention, comprises the time encoding machine TEM and the sample-and-hold circuit SH (FIG. 1). The input signal is provided to the input SHin of the sample-and-hold circuit SH via the analog input In. The output SHout of the sample-and-hold circuit SH is connected to an input TEMin of the time encoding machine TEM, while the output TEMout of the time encoding machine is connected to the time output Out of the apparatus, and to the control input SHctr of the sample-and-hold circuit SH.

Figure 2:
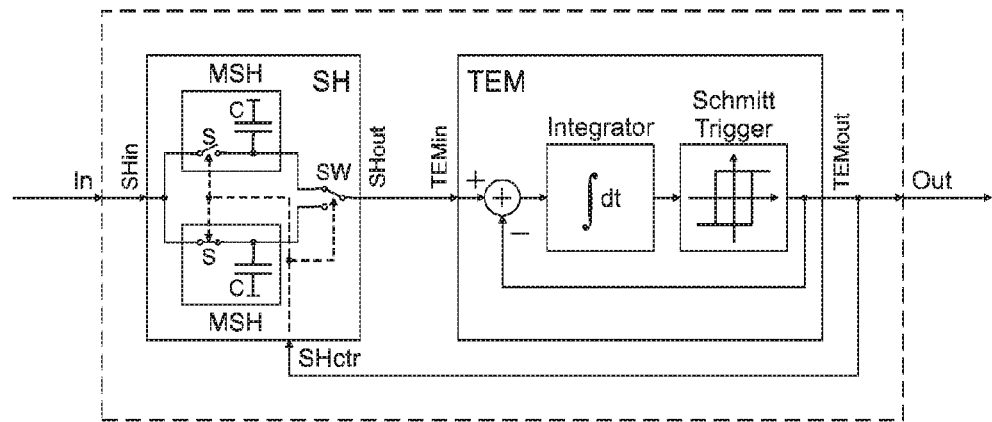
FIG. 2 illustrates the schematic diagram of the apparatus comprising the sample-and-hold circuit SH with two modules MSH, and with the asynchronous Sigma-Delta modulator that acts as the time encoding machine TEM.

In the second embodiment, the apparatus for encoding analog signal into time intervals, according to the invention, comprises two modules MSH, and the asynchronous Sigma-Delta modulator acts as the time encoding machine TEM (FIG. 2).

The analog signal is provided to the signal input In of the apparatus, which is connected to the input SHin of the sample-and-hold circuit SH. Each of two modules MSH of the sample-and-hold circuit SH comprises a capacitor C and an on-off switch S. A top plate of the capacitor C is connected through a relevant on-off switch S to the input SHin of the sample-and-hold circuit SH, and through a change-over switch SW to the output SHout of the sample-and-hold circuit SH. A bottom top plate of the capacitor C is connected to the ground of the circuit. Control inputs of both on-off switches S, and a control input of the change-over switch SW are coupled together and connected to the control input SHctr of the sample-and-hold circuit SH. The output SHout of the sample-and-hold circuit SH is connected to the input TEMin of the time encoding machine TEM realized as the asynchronous Sigma-Delta modulator comprising an adder, an integrator and Schmitt trigger. The output TEMout of the time encoding machine TEM, which is at the same time the time output Out of the apparatus is connected to the control input SHctr of the sample-and-hold circuit SH.

Figure 3:
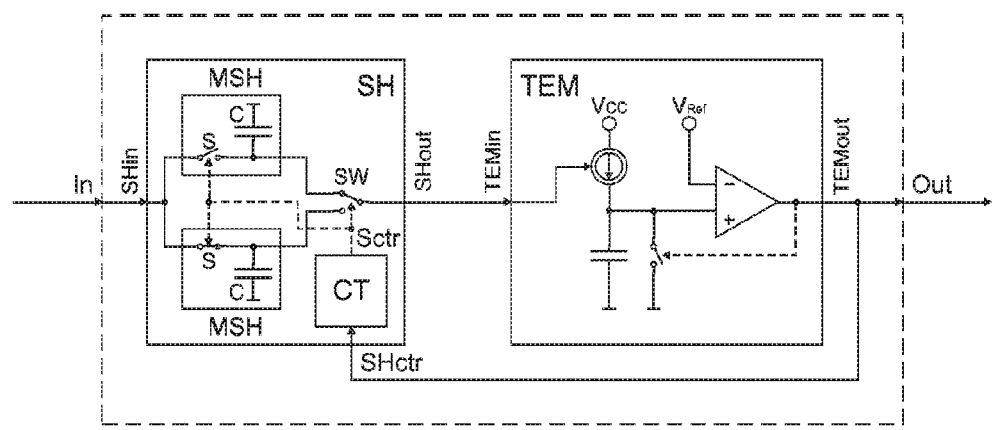
FIG. 3 illustrates the schematic diagram of the apparatus comprising the sample-and-hold circuit SH with two modules MSH, and with the Spiking-Neuron that acts as the time encoding machine TEM.

In the third embodiment, the sample-and-hold circuit SH comprises two modules MSH and a modulo two counter CT, while the time encoding machine TEM is realized as the known Spiking-Neuron circuit (FIG. 3). The analog signal is provided to the signal input In of the apparatus, which is connected to the input SHin of the sample-and-hold circuit SH. Each of two modules MSH of the sample-and-hold circuit SH comprises the capacitor C and the on-off switch S. The top plate of the capacitor C is connected through the relevant on-off switch S to the to the input SHin of the sample-and-hold circuit SH, and through the change-over switch SW to the output SHout of the sample-and-hold circuit SH. The bottom plate of the capacitor C is connected to the ground of the circuit. The control inputs of both on-off switches S, and the control input of the change-over switch SW are coupled together and connected to the control output Sctr of the modulo two counter CT.

The output SHout of the sample-and-hold circuit SH is connected to the input TEMin of the time encoding machine TEM realized as the known Spiking-Neuron circuit comprising a controlled current source, a capacitor, a comparator, a reference voltage source, and an on-off switch. The output TEMout of the time encoding machine TEM, which is simultaneously the time output Out of the apparatus is connected to the control input SHctr of the sample-and-hold circuit SH, which is at the same time the input of the modulo two counter CT.

Time encoding of analog signal into time intervals in the first embodiment, according to the invention, is realized as follows (FIG. 1).

The value of a sample is held on the input TEMin of the time encoding machine TEM during a generation of a time interval T. The value of this sample represents an instantaneous value of encoded analog signal sampled and locked by the use of the sample-and-hold circuit SH when the time encoding machine terminates the generation of the previous time interval $T_{x-1}$. Due to holding a sample of a constant value on the input TEMin of the time encoding machine TEM, the width of the time interval $T_x$ generated by the time encoding machine TEM represents the instantaneous value of encoded analog signal. At the same time, the termination of the time interval $T_x$ produced by the time encoding machine TEM, which is signalled on the output TEMout of the time encoding machine TEM, causes a capture and locking of the next sampled of the analog signal by the sample-and-hold circuit SH, and a next samples represents a new instantaneous value of the analog signal, and the cycle is repeated.

Time encoding of analog signal into time intervals in the second embodiment (FIG. 2), according to the invention, is realized as follows. The value of a sample is held on the input TEMin of the time encoding machine TEM during a generation of a time interval $T_x$. The value of this sample represents an instantaneous value of encoded analog signal sampled and locked by the use of the sample-and-hold circuit SH when the time encoding machine terminates the generation of the previous time interval $T_{x-1}$.

Figure 4:
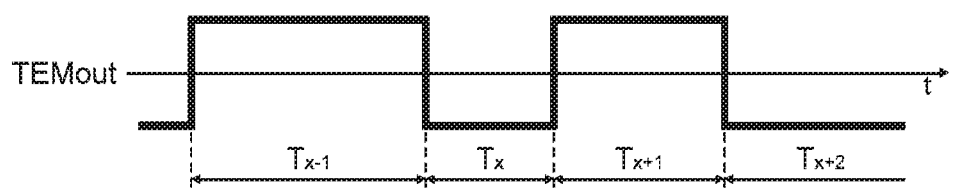
FIG. 4 illustrates the output signal TEMout of the asynchronous Sigma-Delta modulator representing time intervals produced in time encoding process.

The time encoding machine TEM holds a low state on the output TEMout during the time interval $T_x$ (FIG. 4). The low state provided through the control input SHctr of the sample-and-hold circuit SH to the control inputs of the on-off switch S, and to the control input the change-over switch SW, causes the opening of the on-off switch S of the upper module MSH of the sample-and-hold circuit SH, and the disconnection of the capacitor C of the upper module MSH from the input SHin of the sample-and-hold circuit SH.

In this way, the upper module MSH is kept in the hold mode. A low state provided to the control input of the change-over switch SW causes the switching of the change-over switch SW into the upper position, and the connection of the input TEMin of the time encoding machine TEM to the capacitor C of the upper module MSH. The capacitor C keeps a constant voltage on the input TEMin of the time encoding machine TEM, and this voltage corresponds to an instantaneous value of the analog signal frozen when the time encoding machine terminates the generation of the previous time interval $T_{x-1}$. The low state provided to the control input of the on-off switch S causes the closure of the on-off switch S of the lower module MSH of the sample-and-hold circuit SH, and the connection of the capacitor C of the lower module MSH of the sample-and-hold circuit SH to the input SHin of the sample-and-hold circuit SH. In this way, the lower module MSH is kept in the sample mode, and the voltage on the capacitor C of the lower module MSH follows the analog signal.

At the instant when the generation of the time interval $T_x$ is terminated, and at the same time, the generation of the time interval $T_{x+1}$ is started, the output TEMout of the time encoding machine TEM is switched to the high state (FIG. 4). The high state provided through the control input SHctr of the sample-and-hold circuit SH to the control input of the on-off switch S, and to the control input the change-over switch SW, causes the opening of the on-off switch S of the lower module MSH of the sample-and-hold circuit SH, and the disconnection of the capacitor C of the lower module MSH from the input SHin of the sample-and-hold circuit SH.

In this way, the voltage on the capacitor C of the lower module MSH is created, and this voltage corresponds to an instantaneous value of the analog signal when the time encoding machine terminates the generation of the previous time interval $T_x$ by the time encoding machine TEM, and the lower module MSH is introduced into the hold mode.

The high state provided to the control input of the change-over switch SW causes the switching of the change-over switch SW into a lower position, and the connection of the input TEMin of the time encoding machine TEM to the capacitor C of the lower module MSH. The capacitor C keeps a constant voltage on the input TEMin of the time encoding machine TEM.

The high state provided to the control input of the on-off switch S of the upper module MSH causes the closure of the on-off switch S of the upper module MSH, and the connection of the capacitor C of the upper module MSH to the input SHin of the sample-and-hold circuit SH. In this way, the upper module MSH is kept in the sample mode, and the voltage on the capacitor C of the upper module MSH follows the analog signal.

At the instant when the generation of the time interval $T_{x+1}$ is terminated, and at the same time the generation of the time interval $T_{x+2}$ is started, the output TEMout of the time encoding machine TEM is switched to the low state (FIG. 4), and the cycle is repeated.

Time encoding of analog signal into time intervals in the third embodiment (FIG. 3), according to the invention, is realized as follows.

Figure 5:
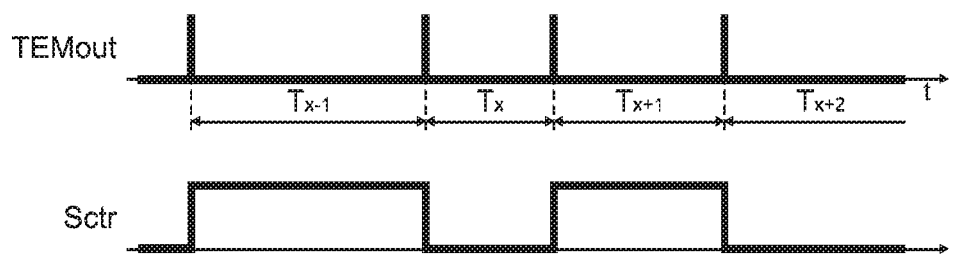
FIG. 5 illustrates the output signal TEMout of the Spiking-Neuron representing time intervals produced in time encoding process.

The modulo two counter CT holds a low state on its output Sctr during a generation of a time interval $T_x$ (FIG. 5). This low state provided to the control input of the on-off switch S, and to the control input the change-over switch SW, causes the opening of the on-off switch S of the upper module MSH of the sample-and-hold circuit SH, and the disconnection of the capacitor C of the upper module MSH from the input SHin of the sample-and-hold circuit SH.

In this way, the upper module MSH is kept in the hold mode. The low state provided to the control input of the change-over switch SW causes the switching of the change-over switch SW into the upper position, and the connection of the input TEMin of the time encoding machine TEM to the capacitor C of the upper module MSH. The capacitor C keeps a constant voltage on the input TEMin of the time encoding machine TEM, and this voltage corresponds to an instantaneous value of the analog signal frozen when the time encoding machine terminates the generation of the previous time interval $T_{x-1}$. The low state provided to the control input of the on-off switch S causes the closure of the on-off switch S of the lower module MSH of the sample-and-hold circuit SH, and the connection of the capacitor C of the lower module MSH of the sample-and-hold circuit SH to the input SHin of the sample-and-hold circuit SH. In this way, the lower module MSH is kept in the sample mode, and the voltage on the capacitor C of the lower module MSH follows the analog signal.

At the instant when the generation of the time interval $T_x$ is terminated, and at the same time the generation of the time interval $T_{x+1}$ is started, a short pulse is produced on the output TEMout of the time encoding machine TEM (FIG. 5). This pulse provided through the control input SHctr of the sample-and-hold circuit SH to the input of the modulo two counter CT causes the switching of the output Sctr of the modulo two counter CT to the high state (FIG. 5).

The high state provided to the control input of the on-off switch S, and to the control input of the change-over switch SW causes the opening of the on-off switch S of the lower module MSH, and the disconnection of the capacitor C of the lower module MSH from the input SHin of the sample-and-hold circuit SH. In this way, the capacitor C keeps a constant voltage, and this voltage corresponds to an instantaneous value of the analog signal when the time encoding machine TEM terminates the generation of the previous time interval $T_x$, and the lower module MSH is introduced into the hold mode.

The high state provided to the control input of the change-over switch SW causes the switching of the change-over switch SW into the lower position, and the connection of the input TEMin of the time encoding machine TEM to the capacitor C of the lower module MSH. The capacitor C keeps a constant voltage on the input TEMin of the time encoding machine TEM.

The high state provided to the control input of the on-off switch S of the upper module MSH causes the closure of the on-off switch S of the upper module MSH, and the connection of the capacitor C of the upper module MSH to the input SHin of the sample-and-hold circuit SH. In this way, the upper module MSH is kept in the sample mode, and the voltage on the capacitor C of the upper module MSH follows the analog signal.

At the instant when the generation of the time interval $T_{x+1}$ is terminated, and at the same time the generation of the time interval $T_{x+2}$ is started, a short is produced on the output TEMout of the time encoding machine TEM (FIG. 5). This pulse provided through the control input SHctr of the sample-and-hold circuit SH to the input of the modulo two counter CT causes the switching of the output Sctr of the modulo two counter CT to the low state (FIG. 5), and the cycle is repeated.

ACRONYMS

| | |
|---|---|
| In | signal input |
| Out | time output |
| TEM | time encoding machine |
| TEMin | time encoding machine input |
| TEMout | time encoding machine output |
| SH | sample-and-hold circuit |
| SHin | sample-and-hold circuit input |
| SHout | sample-and-hold circuit output |
| SHctr | sample-and-hold circuit control input |
| CT | modulo two counter |
| Sctr | modulo two counter output |
| MSH | module of sample-and-hold circuit |
| S | on-off switch |
| SW | change-over switch |
| C | capacitor |

What is claimed is:

1. A method for encoding analog signal into time intervals, the method comprising:
generating time intervals using a time encoding machine, wherein widths of time intervals represent values of analog signal, wherein a signal of a constant value is held during a generated time interval on a time encoding machine input by the use of a sample-and-hold circuit, and wherein the constant value of the signal held during the generated time interval represents an instantaneous value of the analog signal at the end of generation of a previous time interval.

2. The method according to claim 1, wherein the instantaneous value of the analog signal is sampled and locked by the use of the sample-and-hold circuit when the time encoding machine terminates the generation of the previous time interval.

3. The method according to claim 1, wherein the signal having a constant value is held on a time encoding machine input during a generated time interval by the use of one of modules of the sample-and-hold circuit, and an actual value of the analog signal is sampled by the use of one of modules of the sample-and-hold circuit, wherein roles of the modules of the sample-and-hold circuit are interchanged cyclically at the end of generation of each time interval.

4. An apparatus for encoding analog signal into time intervals, the apparatus comprising a time encoding machine equipped with a signal input and a time output, wherein the analog signal is provided to an input of the sample-and-hold circuit via a signal input, and an output of the sample-and-hold circuit is connected to an input of the time encoding machine, wherein an output of the time encoding machine is connected to a time output of the apparatus, and to a control input of the sample-and-hold circuit.

5. The apparatus according to claim 4, wherein the sample-and-hold circuit comprises at least two sample-and-hold modules.

6. The apparatus according to claim 4, wherein an asynchronous Sigma-Delta modulator acts as the time encoding machine.

7. The apparatus according to claim 4, wherein a Spiking-Neuron circuit acts as the time encoding machine.

* * * * *